(12) United States Patent
Chen et al.

(10) Patent No.: US 8,679,891 B2
(45) Date of Patent: Mar. 25, 2014

(54) HETEROSTRUCTURE CONTAINING IC AND LED AND METHOD FOR FABRICATING THE SAME

(71) Applicant: National Chiao Tung University, Hsinchu (TW)

(72) Inventors: Kuan-Neng Chen, Hsinchu (TW); Cheng-Ta Ko, Hsinchu (TW); Wei-Chung Lo, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/019,933

(22) Filed: Sep. 6, 2013

(65) Prior Publication Data
US 2014/0004630 A1    Jan. 2, 2014

Related U.S. Application Data (62) Division of application No. 13/224,607, filed on Sep. 2, 2011, now Pat. No. 8,536,613.

(30) Foreign Application Priority Data

Jun. 7, 2011 (TW) .............................. 100119755 A (51) Int. Cl.
*H01L 33/62* (2010.01)
(52) U.S. Cl.
USPC .............................................. 438/79; 257/99
(58) Field of Classification Search
USPC .................... 257/99, E33.066; 438/23, 26
See application file for complete search history.

(56) References Cited

U.S. PATENT DOCUMENTS

| 7,456,035 | B2 | 11/2008 | Eliashevich et al. | |
|---|---|---|---|---|
| 7,754,507 | B2 | 7/2010 | Epler et al. | |
| 2003/0227021 | A1* | 12/2003 | Yamazaki et al. | 257/83 |
| 2005/0023550 | A1* | 2/2005 | Eliashevich et al. | 257/99 |
| 2007/0111387 | A1* | 5/2007 | Oi | 438/108 |
| 2008/0191632 | A1 | 8/2008 | Lee | |
| 2011/0104836 | A1 | 5/2011 | Rode et al. | |
| 2012/0086023 | A1* | 4/2012 | Veerasamy et al. | 257/88 |

FOREIGN PATENT DOCUMENTS

| JP | H06-334217 A | 12/1994 |
|---|---|---|
| JP | H07-131076 A | 5/1995 |
| JP | 2001-184918 A | 7/2001 |
| JP | 2003-101076 A | 4/2003 |
| JP | 2005-51255 A | 2/2005 |
| JP | 2006-344971 A | 12/2006 |
| JP | 2008-112030 A | 5/2008 |
| JP | 2009-135543 A | 6/2009 |

(Continued)

*Primary Examiner* — Thao Le
(74) *Attorney, Agent, or Firm* — Rosenberg, Klein & Lee (57) ABSTRACT

A heterostructure containing IC and LED and a method of fabricating. An IC and an LED are established with the IC having a first electric-conduction block and a first connection block. The IC electrically connects to the first electric-conduction block. A first face of the LED has a second electric-conduction block and a second connection block. The LED is electrically connected to the second electric-conduction block. The first electric-conduction block and the first connection block are respectively joined to the second electric-conduction block and the second connection block, and the first electric-conduction block are electrically connected with the second electric-conduction block to form a heterostructure. The heterostructure provides functions of heat radiation and electric communication for IC and LED.

11 Claims, 7 Drawing Sheets

(56) References Cited

FOREIGN PATENT DOCUMENTS

| | | |
|---|---|---|
| JP | 2010-263050 A | 11/2010 |
| JP | 2011-525708 A | 9/2011 |
| KR | 10-0634307 B1 | 10/2006 |
| KR | 10-2011-0046122 A | 5/2011 |

* cited by examiner

HETEROSTRUCTURE CONTAINING IC AND LED AND METHOD FOR FABRICATING THE SAME

RELATED APPLICATIONS

This application is a Divisional patent application of application Ser. No. 13/224,607, filed on 2 Sep. 2011, now pending. The entire disclosure of the prior application Ser. No. 13/224,607, from which an oath or declaration is supplied, is considered a part of the disclosure of the accompanying Divisional application and is hereby incorporated by reference.

BACKGROUND OF THE INVENTION

1. Field of the Invention

The present invention relates to a heterostructure technology, particularly to a heterostructure containing IC and LED and a method for fabricating the same.

2. Description of the Related Art

LED (Light Emitting Diode) is a luminescent element, wherein electrons and holes recombine to release light. LEDs made of different materials emit monochromatic lights having different wavelength, which may be categorized into the visible lights and the invisible lights. Compared with the conventional bulb, LED has advantages of high power efficiency, high impact resistance and high blink speed. Therefore, LED has been an indispensable element for daily living.

Figure 1A:
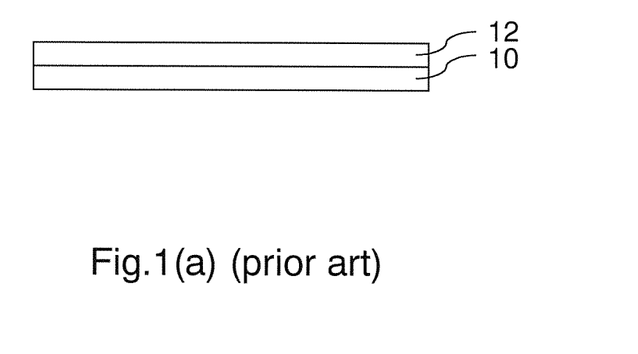
FIGS. 1(a) to 1(c) are sectional views showing conventional steps for fabricating LED with heat-radiating function.
Figure 1B:
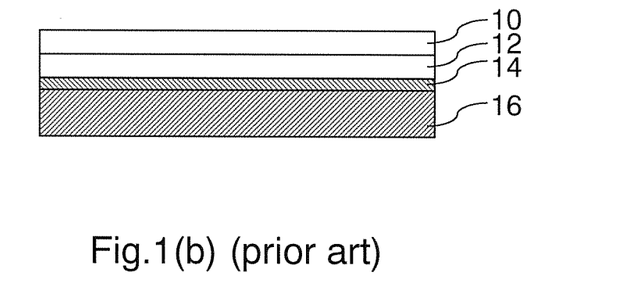
Figure 1C:
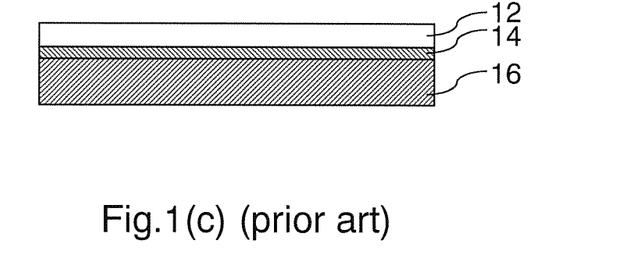

Refer to FIGS. 1(a) to 1(c) sectional views showing conventional steps of fabricating LED with heat-radiating function. In FIG. 1(a), fabricate a LED 12 on a sapphire substrate 10 with a deposition method. Next, in FIG. 1(b), use a metal adhesive layer 14 to join the LED 12 with a high thermal conductivity silicon substrate 16. Next, in FIG. 1(c), remove the sapphire substrate 10. The objective of joining the LED 12 with the silicon substrate 16 is to use the high thermal conductivity of the silicon substrate 16 to assist in heat radiation. None electric connection exists between the LED 12 and the silicon substrate 16. The whole metal adhesive layer 14 is only to mechanically join the LED 12 and the silicon substrate 16. Thereby, heat generated by the LED 12 is transmitted downward to the silicon substrate 16 and effectively dissipated. The conventional technologies for fabricating LED are mainly high-temperature processes, which have high thermal budget and result in high thermal stress in LED. Besides, the conventional technologies cannot integrate LED with functional IC.

Accordingly, the present invention proposes a heterostructure containing IC and LED to overcome the abovementioned problems.

SUMMARY OF THE INVENTION

The primary objective of the present invention is to provide a heterostructure containing IC and LED and a method for fabricating the same, wherein IC and LED are stacked and joined with a metal and a joining block in a hybrid bonding method, whereby is achieved the heat-radiating function of IC and LED and the electric communication between IC and LED, and whereby is accomplished the development and application of a high-density and multifunctional heterostructure.

To achieve the abovementioned objective, the present invention proposes a heterostructure containing IC and LED, which comprises an IC and an LED. The IC has at least one connection structure and at least one electric-conduction structure on the surface thereof, and the IC is electrically connected with the electric-conduction structure. The LED has a first face and a second face opposite to the first face. The first face of the LED is joined to and electrically connected with the electric-conduction structure, whereby the LED is integrated with the IC. Further, the LED may have an electric-conduction through-hole electrically connected with the electric-conduction structure. Besides, the second face of the LED may have an electric-conduction block electrically connected with the electric-conduction through-hole, whereby other structures can be easily stacked on the LED.

The present invention also proposes a method for fabricating a heterostructure containing IC and LED, which comprises steps: providing an IC and an LED, wherein the IC has at least one first electric-conduction block and at least one first connection block on the surface thereof, and wherein the IC is electrically connected with the first electric-conduction block, and wherein the LED has a first face and a second face opposite to the first face, and wherein the first face has at least one second electric-conduction block and at least one second connection block, and wherein the LED is electrically connected with the second electric-conduction block; respectively joining the first electric-conduction block and the first connection block to the second electric-conduction block and the second connection block so as to join the IC to the LED, and electrically connecting the first electric-conduction block with the second electric-conduction block, whereby is formed a heterostructure where other structures are easily stacked on the LED. Besides, the LED may further have an electric-conduction through-hole electrically connected with the electric-conduction structure, and the second face has a third electric-conduction block electrically connected with the electric-conduction through-hole.

Below, the embodiments are described in detail in cooperation with the drawings to make easily understood the technical contents, characteristic and accomplishments of the present invention.

DETAILED DESCRIPTION OF THE INVENTION

Figure 2:
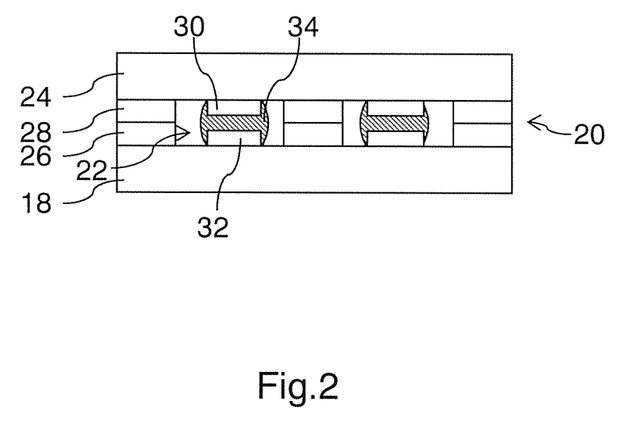
FIG. 2 is a sectional view schematically a heterostructure containing IC and LED according to a first embodiment of the present invention.
Figure 3A:
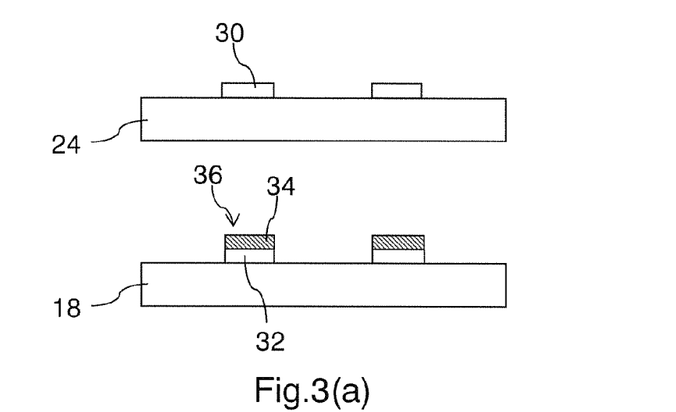
FIGS. 3(a) to 3(c) are sectional views schematically showing steps of fabricating a heterostructure containing IC and LED according to the first embodiment of the present invention.
Figure 3B:
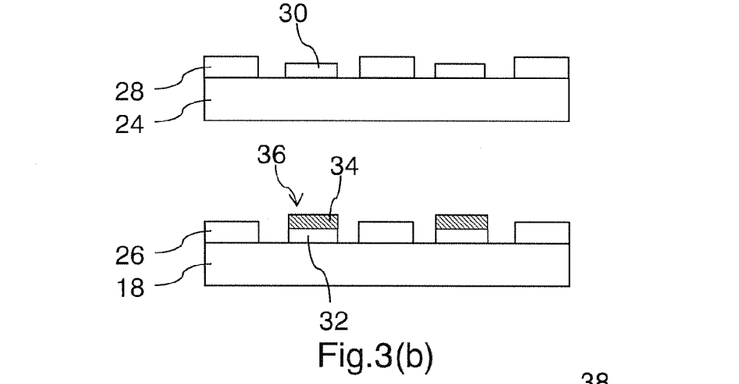
Figure 3C:
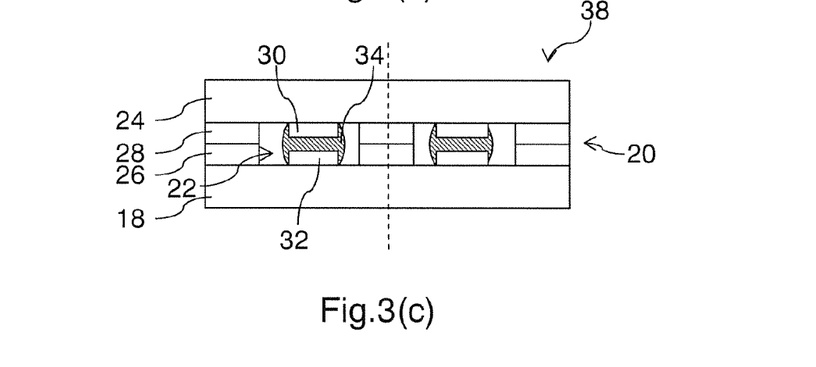
Figure 3D:
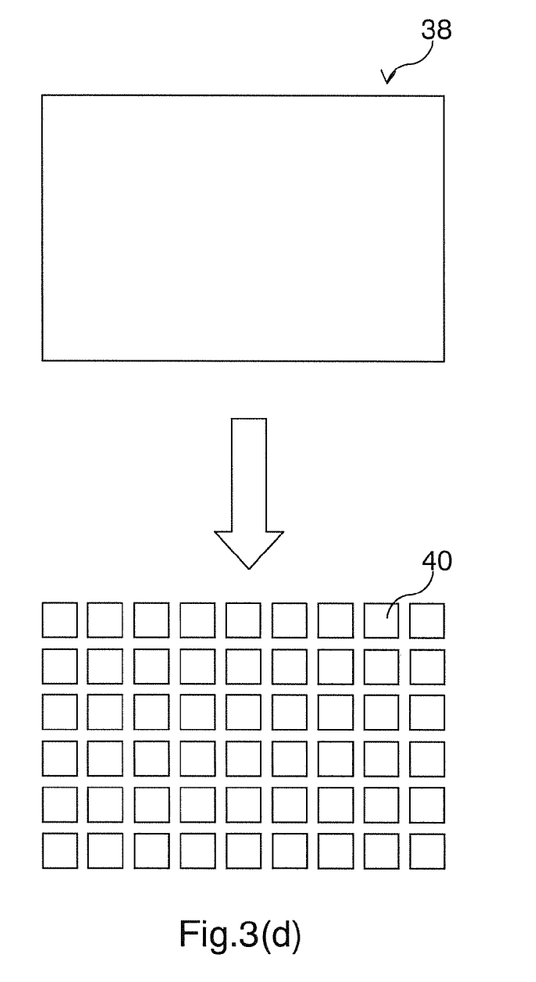
FIG. 3(d) is a diagram schematically showing a cutting step according to the first embodiment of the present invention.

Refer to FIG. 2 for a heterostructure containing IC and LED according to a first embodiment of the present invention. The present invention comprises an IC (Integrated Circuit) 18 and an LED 24. The IC 18 has at least one connection structure 20 and at least one electric-conduction structure 22 on the surface thereof. The IC 18 is electrically connected with the electric-conduction structure 22. The LED 24 has a first face and a second face opposite to the first face. The first face of the LED 24 is on the connection structure 20 and the electric-conduction structure 22 so as to join to the IC 18 and electrically connect with the electric-conduction structure 22. The IC 18 is a multifunctional one and may function as a power source of the LED 24, a logic/control processor, a memory, a CMOS (Complementary Metal Oxide Semiconductor) image sensor, an RF (Radio Frequency) IC, etc. Distinct from the conventional technology, the present invention replaces the silicon substrate with an IC. Thereby, the present invention realizes the heat radiation of the IC 18 and the LED 24 and the electric communication between the IC 18 and the LED 24. Thus is accomplished the development and application of a high-density and multifunctional heterostructure.

The connection structure 20 further comprises a first connection block 26 and a second connection block 28, which may comprise a polymeric material stable below a temperature of 250° C., such as an epoxy-based photoresist SU-8. The first connection block 26 is arranged on the surface of the IC 18. The second connection block 28 is arranged on the first face of the LED 24 and joined to the first connection block 26. The electric-conduction structure 22 further comprises a first electric-conduction block and a second electric-conduction block 30, which comprise a metallic material. The first electric-conduction block is arranged on the surface of the IC 18 and electrically connected with the IC 18. The second electric-conduction block 30 is arranged on the first face of the LED 24 and electrically connected with the LED 24. The second electric-conduction block 30 is joined to and electrically connected with the first electric-conduction block. The first electric-conduction block includes a high-temperature metallic connection block 32 disposed on the surface of the IC and a low-temperature metallic connection block 34 joined to and electrically connected with the high-temperature metallic connection block 32 and the second electric-conduction block 30. The low-temperature metallic connection block 34 may comprise a metallic material stable below a temperature of 250° C., such as tin or indium. In other words, the IC 18 and the LED 24 are joined by a metallic material and a polymeric material in a hybrid bonding way, wherein the metallic material and the polymeric material both function as the joint material but respectively implement electric communication and structural strengthening. Thereby, the present invention not only realizes the electric communication between the IC 18 and the LED 24 but also polymerically fills the micro-gap between the IC 18 and the LED 24. Thus is improved the bonding strength of the IC 18 and the LED 24 and the reliability of the stacked element.

Below is described the method for fabricating the heterostructure containing IC and LED according to the first embodiment of the present invention. Refer to FIGS. 3(*a*) to 3(*d*) sectional views schematically showing steps of fabricating the heterostructure containing IC and LED according to the first embodiment of the present invention. Firstly, as shown in FIG. 3(*a*), form the high-temperature metallic connection block 32 on the surface of the IC 18 and electrically connect the high-temperature metallic connection block 32 with the IC 18; form the low-temperature metallic connection block 34 on the high-temperature metallic connection block 32 and electrically connect the low-temperature metallic connection block 34 with the high-temperature metallic connection block 32, whereby the high-temperature metallic connection block 32 and the low-temperature metallic connection block 34 form the first electric-conduction block 36. At the same time, form the second electric-conduction block 30 on the first face of the LED 24 and electrically connect the second electric-conduction block 30 with the LED 24. The high-temperature metallic connection block 32, the low-temperature metallic connection block 34 and the second electric-conduction block 30 are fabricated with a photolithographic technology, an electroplating technology and an etching technology. Next, as shown in FIG. 3(*b*), respectively form the first connection block 26 and the second connection block 28 on the surface of the IC 18 and the first face of the LED 24 with a photolithographic technology. A low-temperature process is more suitable to the LED 24, and the connection material and the electric-conduction material also allow a low-temperature process. Therefore, as shown in FIG. 3(*c*), process the first and second connection blocks 26 and 28 and the first and second electric-conduction blocks 30 and 36 at a temperature of as low as 25-250° C. to make the first connection block 26 and the low-temperature metallic connection block 34 of the first electric-conduction block 36 respectively join with the second connection block 28 and the second electric-conduction block 30, whereby is completed the joint of the IC 18 and the LED 24, and whereby is completed the electric connection of the low-temperature metallic connection block 34 and the second electric-conduction block 30. Thus is completed a low-temperature joined heterostructure 38. Next, as shown in FIG. 3(*d*), perform a cutting process along the dotted line shown in FIG. 3(*c*) to dice the heterostructure 38 containing the ICs 18 and the LEDs 24 into a plurality of heterostructure units 40.

In the abovementioned steps, the step shown in FIG. 3(*d*) can be omitted. In FIG. 3(*a*), the step to form the high-temperature metallic connection block 32 and the low-temperature metallic connection block 34 on the IC 18 can be replaced by a step of directly forming the first electric-conduction block 36 containing the high-temperature and low-temperature metallic connection blocks 32 and 34 on the IC 18, wherein the high-temperature metallic connection block 32 must be interposed between the low-temperature metallic connection block 34 and the IC 18. Further, the steps shown in FIG. 3(*a*) and FIG. 3(*b*) can be replaced by a single step, wherein is directly provided an IC 18 having at least one first electric-conduction block 36 and at least one first connection block 26 on the surface thereof and electrically connected with the first electric-conduction block 36, and wherein is directly provided an LED 24 having at least one second electric-conduction block 30 and at least one second connection block 28 on the first face thereof and electrically connected with the second electric-conduction block 30. The alternative step is also illustrated by FIG. 3(*b*). Then, undertake the step shown in FIG. 3(*c*).

Figure 4:
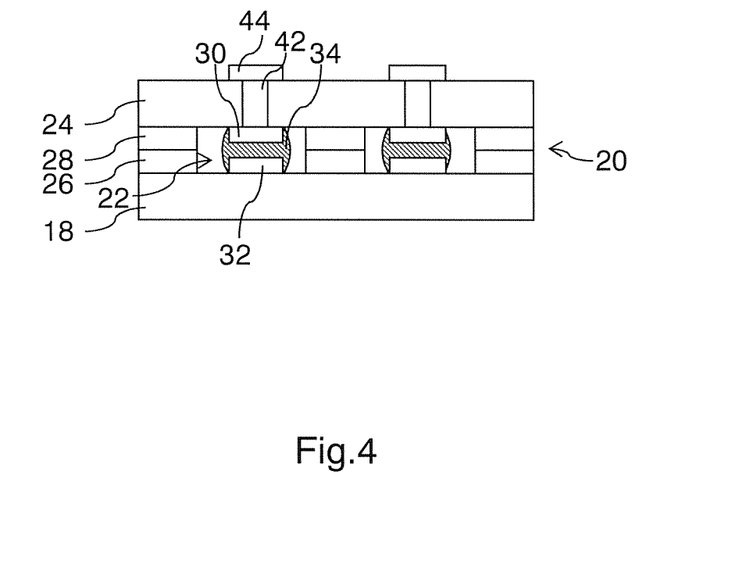
FIG. 4 is a sectional view schematically a heterostructure containing IC and LED according to a second embodiment of the present invention.
Figure 5A:
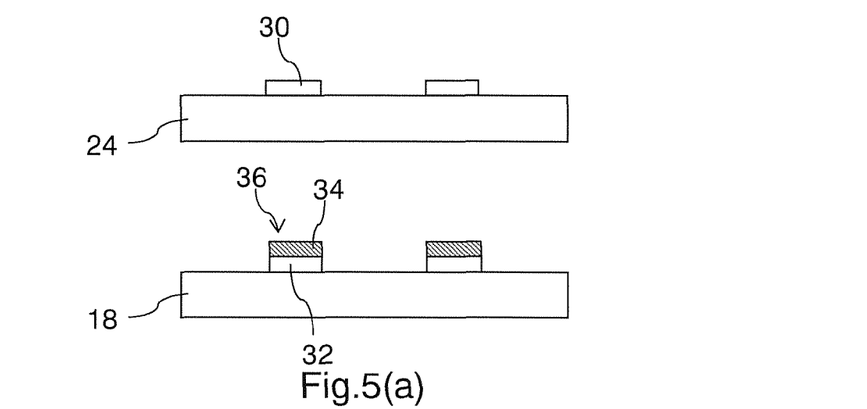
FIGS. 5(a) to 5(d) are sectional views schematically showing steps of fabricating a heterostructure containing IC and LED according to the second embodiment of the present invention.
Figure 5B:
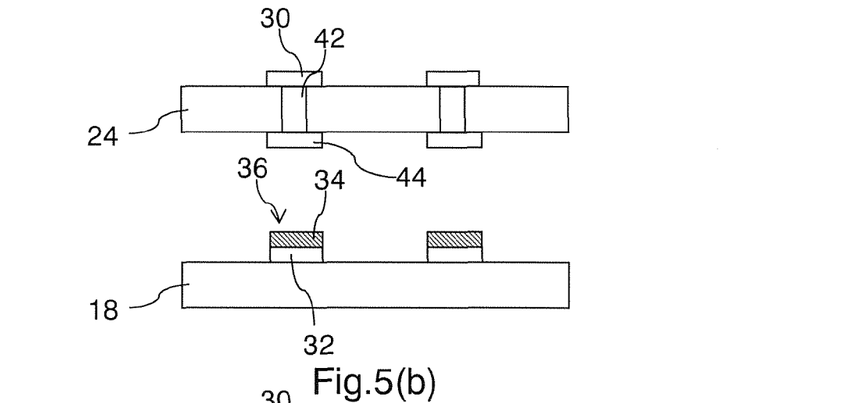
Figure 5C:
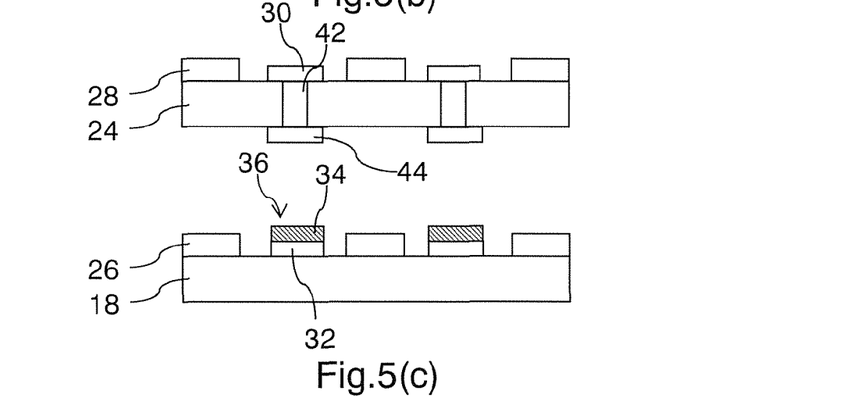
Figure 5D:
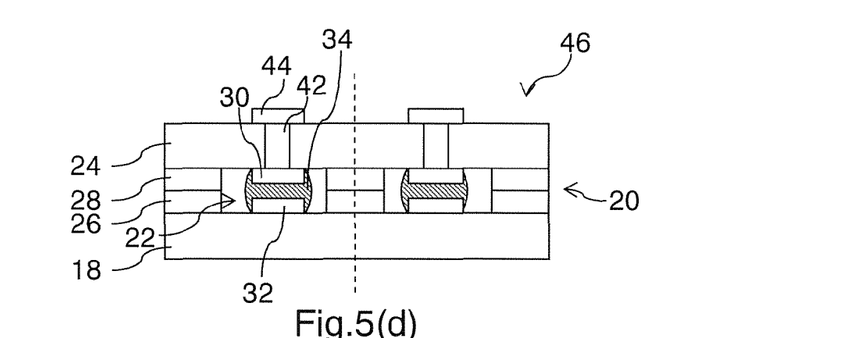
Figure 5E:
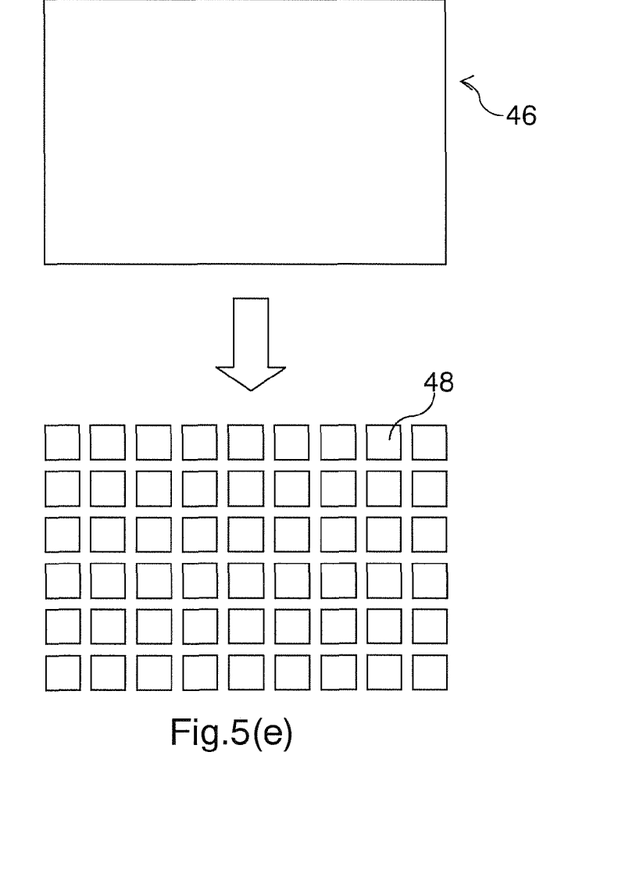
FIG. 5(e) is a diagram schematically showing a cutting step according to the second embodiment of the present invention.

Below is described a second embodiment of the present invention. Refer to FIG. 4. The second embodiment is basically similar to the first embodiment. However, the second embodiment is different from the first embodiment in that the LED 24 has an electric-conduction through-hole 42 electrically connected with the second electric-conduction block 30 of the electric-conduction structure 22 and that at least one third electric-conduction block 44 comprising a metallic material is formed on the second face of the LED 24 and electrically connected with the electric-conduction through-hole 42.

Below is described the method for fabricating the heterostructure containing IC and LED according to the second embodiment of the present invention. Refer to FIGS. 5(*a*) to 5(*e*). Firstly, as shown in FIG. 5(*a*), form the high-temperature metallic connection block 32 on the surface of the IC 18 and electrically connect the high-temperature metallic connection block 32 with the IC 18; form the low-temperature metallic connection block 34 on the high-temperature metallic connection block 32 and electrically connect the low-temperature metallic connection block 34 with the high-temperature metallic connection block 32, whereby the high-temperature metallic connection block 32 and the low-temperature metallic connection block 34 form the first electric-conduction block 36. At the same time, form the second electric-conduction block 30 on the first face of the LED 24 and electrically connect the second electric-conduction block 30 with the LED 24. The high-temperature metallic connection block 32, the low-temperature metallic connection block 34 and the second electric-conduction block 30 are fabricated with a photolithographic technology, an electroplating technology and an etching technology. Next, as shown in FIG. 5(*b*), firstly form the electric-conduction through-hole 42 in the LED 24 and electrically connect the electric-conduction through-hole 42 with the second electric-conduction block 30. Next, use a photolithographic technology, an electroplating technology and an etching technology to form the third electric-conduction block 44 on the second face of the LED 24 and electrically connect the third electric-conduction block 44 with the electric-conduction through-hole 42. Thereby, the LED 24 can be easily installed, and other elements can be easily stacked up. Next, as shown in FIG. 5(*c*), respectively form the first and second connection blocks 26 and 28 on the surface of the IC 18 and the first face of the LED 24 with a photolithographic technology. Next, similarly to the first embodiment, process the first and second connection blocks 26 and 28 and the first and second electric-conduction blocks 30 and 36 at a temperature of as low as 25-250° C. to make the first connection block 26 and the low-temperature metallic connection block 34 of the first electric-conduction block 36 respectively join with the second connection block 28 and the second electric-conduction block 30, whereby is completed the joint of the IC 18 and the LED 24, and whereby is completed the electric connection of the low-temperature metallic connection block 34 and the second electric-conduction block 30, as shown in FIG. 5(*d*). Thus is completed a low-temperature joined heterostructure 46. Next, as shown in FIG. 5(*e*), perform a cutting process along the dotted line shown in FIG. 5(*d*) to dice the heterostructure 46 containing the ICs 18 and the LEDs 24 into a plurality of heterostructure units 48.

In the abovementioned steps, the step shown in FIG. 5(*e*) can be omitted. In FIG. 5(*a*), the step to form the high-temperature metallic connection block 32 and the low-temperature metallic connection block 34 on the IC 18 can be replaced by a step of directly forming the first electric-conduction block 36 containing the high-temperature and low-temperature metallic connection blocks 32 and 34 on the IC 18, wherein the high-temperature metallic connection block 32 must be interposed between the low-temperature metallic connection block 34 and the IC 18. Further, the steps shown in FIGS. 5(*a*)-5(*c*) can be replaced by a single step, wherein is directly provided an IC 18 having at least one first electric-conduction block 36 and at least one first connection block 26 on the surface thereof and electrically connected with the first electric-conduction block 36, and wherein is directly provided an LED 24 having at least one second electric-conduction block 30 and at least one second connection block 28 on the first face thereof and electrically connected with the second electric-conduction block 30. The alternative step is also illustrated by FIG. 5(*c*). Then, undertake the step shown in FIG. 5(*d*).

In conclusion, the heterostructure technology of the present invention not only provides a heat-radiation function for IC and LED but also provides an electric-communication function between IC and LED and thus can be used to realize a high-density and multifunctional heterostructure.

The embodiments described above are only to exemplify the present invention but not to limit the scope of the present invention. Any equivalent modification or variation according to the structure, characteristic or spirit disclosed in the present invention is to be also included within the scope of the present invention.

What is claimed is:

1. A method for fabricating a heterostructure containing an integrated circuit (IC) and a light emitting diode (LED), comprising steps:

providing an IC and an LED, wherein at least one first electric-connection block and at least one first connection block are arranged on one surface of said IC, and wherein said first electric-connection block is electrically connected with said IC, and wherein said LED has a first face and a second face opposite to said first face, and wherein said first face has at least one second electric-conduction block and at least one second connection block, and wherein said second electric-conduction block is electrically connected with said LED; and respectively joining said first electric-conduction block and said first connection block to said second electric-conduction block and said second connection block so as to bond said IC to said LED and realize electric connection of said first electric-conduction block and said second electric-conduction block.

2. The method for fabricating a heterostructure containing IC and LED according to claim 1, wherein said step of providing said IC having said first electric-connection block and said first connection block further comprises steps:

forming said first electric-conduction block on said surface and electrically connecting said first electric-conduction block with said IC; and forming said first connection block on said surface.

3. The method for fabricating a heterostructure containing IC and LED according to claim 2, wherein said first electric-connection block is fabricated with a photolithographic process, an electroplating process and an etching process, and wherein said first connection block is fabricated with a photolithographic process.

4. The method for fabricating a heterostructure containing IC and LED according to claim 2, wherein said step of forming said first electric-conduction block on said surface further comprises steps:

forming a high-temperature metallic connection block on said surface and electrically connecting said high-temperature metallic connection block with said IC; and forming a low-temperature metallic connection block on said high-temperature metallic connection block and electrically connecting said low-temperature metallic connection block with said high-temperature metallic connection block.

5. The method for fabricating a heterostructure containing IC and LED according to claim 1, wherein said step of providing said LED having said second electric-conduction block and said second connection block further comprises steps:

forming said second electric-conduction block on said first face and electrically connecting said second electric-conduction block with said LED; and forming said second connection block on said first face.

6. The method for fabricating a heterostructure containing IC and LED according to claim 5, wherein said second electric-connection block is fabricated with a photolithographic process, an electroplating process and an etching process, and wherein said second connection block is fabricated with a photolithographic process.

7. The method for fabricating a heterostructure containing IC and LED according to claim 1, wherein said step of bonding said IC to said LED is to process said first connection block, said second connection block, said first electric-conduction block and said second electric-conduction block at a temperature of 25-250° C. to realize a low-temperature joining.

8. The method for fabricating a heterostructure containing IC and LED according to claim 1, wherein in said step of providing said LED having said second electric-conduction block and said second connection block, at least one electric-conduction through-hole is formed in said LED and electrically connected with said second electric-conduction block, and wherein at least one third electric-conduction block is formed on said second face and electrically connected with said electric-conduction through-hole.

9. The method for fabricating a heterostructure containing IC and LED according to claim 8, wherein said step of providing said LED having said second electric-conduction block, said second connection block, said electric-conduction through-hole and said third electric-conduction block further comprises steps:

forming said second electric-conduction block on said first face and electrically connecting said second electric-conduction block with said LED;

forming said electric-conduction through-hole in said LED and electrically connecting said electric-conduction through-hole with said second electric-conduction block;

forming said third electric-conduction block on said second face and electrically connecting said third electric-conduction block with said electric-conduction through-hole; and forming said second connection block on said first face.

10. The method for fabricating a heterostructure containing IC and LED according to claim 9, wherein said second electric-conduction block and said third electric-conduction block are fabricated with a photolithographic process, an electroplating process and an etching process, and wherein said second connection block is fabricated with a photolithographic process.

11. The method for fabricating a heterostructure containing IC and LED according to claim 1 further comprising a cutting step, wherein said ICs and said LEDs are diced into a plurality of heterostructure units.

\* \* \* \* \*